(12) United States Patent
Yang et al.

(10) Patent No.: US 10,009,599 B2
(45) Date of Patent: Jun. 26, 2018

(54) TOUCH GLASSES-FREE GRATING 3D DISPLAY DEVICE AND MANUFACTURING AND CONTROL METHODS THEREOF

(71) Applicants: BOE Technology Group Co., Ltd., Beijing (CN); Beijing BOE Optoelectronics Technology Co., Ltd., Beijing (CN)

(72) Inventors: Shengji Yang, Beijing (CN); Xue Dong, Beijing (CN); Hailin Xue, Beijing (CN); Haisheng Wang, Beijing (CN); Wenqing Zhao, Beijing (CN); Xiaoliang Ding, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 117 days.

(21) Appl. No.: 14/910,152

(22) PCT Filed: Sep. 30, 2015

(86) PCT No.: PCT/CN2015/091168
§ 371 (c)(1),
(2) Date: Feb. 4, 2016

(87) PCT Pub. No.: WO2016/161786
PCT Pub. Date: Oct. 13, 2016

(65) Prior Publication Data
US 2017/0048516 A1    Feb. 16, 2017

(30) Foreign Application Priority Data
Apr. 9, 2015    (CN) .......................... 2015 1 0165936

(51) Int. Cl.
*G02F 1/15*    (2006.01)
*G02F 1/153*    (2006.01)
(Continued)

(52) U.S. Cl.
CPC ....... *H04N 13/0409* (2013.01); *G02B 27/225* (2013.01); *G02B 27/2214* (2013.01);
(Continued)

(58) Field of Classification Search
CPC .......... G02F 1/1335; G02F 1/15; G02F 1/167; G02F 1/155; G02F 1/13338; G02F 1/153;
(Continued)

(56) References Cited

U.S. PATENT DOCUMENTS 8,115,985 B2 *  2/2012  Liu ................... G02B 27/2214
                                                    359/273
2013/0215076 A1   8/2013  Lee et al.

FOREIGN PATENT DOCUMENTS

CN    103018944 A    4/2013
CN    203117601 U    8/2013
(Continued)

OTHER PUBLICATIONS

Aug. 9, 2016—(CN)—First Office Action Appn 201510165936.4 with English Tran.
(Continued)

*Primary Examiner* — Thoi Duong
(74) *Attorney, Agent, or Firm* — Banner & Witcoff, Ltd.

(57) ABSTRACT

A touch glasses-free grating 3D display device and manufacturing and control methods thereof. The touch glasses-free grating 3D display device includes a display panel and an electrochromic 3D glasses-free grating disposed on the display panel. The electrochromic 3D glasses-free grating includes a plurality of mutually parallel first grating electrodes, a plurality of mutually parallel second grating elec-
(Continued)

trodes and an electrochromic material disposed between the plurality of mutually parallel first grating electrodes and the plurality of mutually parallel second grating electrodes. Both the plurality of first grating electrodes and the plurality of second grating electrodes are transparent conductive electrodes. The display panel is provided with or includes a plurality of touch electrodes which are intercrossed with and insulated from the plurality of first grating electrodes and the plurality of second grating electrodes. The first grating electrodes and the second grating electrodes not only can apply 3D driving voltage signals but also can apply touch driving signals or output touch sensing signals.

20 Claims, 10 Drawing Sheets

(51) Int. Cl.
*G02F 1/163* (2006.01)
*H04N 13/04* (2006.01)
*G06F 3/044* (2006.01)
*G02B 27/22* (2018.01)
*G02F 1/155* (2006.01)
*G06F 3/041* (2006.01)
*H01L 27/32* (2006.01)

(52) U.S. Cl.
CPC ............ *G02F 1/155* (2013.01); *G02F 1/1523* (2013.01); *G02F 1/1527* (2013.01); *G02F 1/163* (2013.01); *G06F 3/044* (2013.01); *G06F 3/0412* (2013.01); *G06F 3/0416* (2013.01); *H01L 27/323* (2013.01); *H01L 27/3232* (2013.01); *H04N 13/0422* (2013.01); *G06F 2203/04103* (2013.01); *G06F 2203/04107* (2013.01); *G06F 2203/04111* (2013.01); *H04N 2213/001* (2013.01)

(58) Field of Classification Search
CPC ...... G02F 1/0018; G02F 1/163; G02F 1/1343; G02F 1/134309; G02F 1/13452; G02F 1/1525; G02F 2201/12; G06F 3/0412; G06F 3/0416; G06F 3/044; G06F 3/0421; G06F 3/041; G06F 2203/04103; G06F 2203/04107; G09G 2310/0275; G09G 3/3655; B60R 1/088; B60R 2001/1223
USPC ........ 359/265, 245, 254, 271, 315; 345/107, 345/173, 84, 105, 87; 349/12, 15, 139, 349/138
See application file for complete search history.

(56) References Cited

FOREIGN PATENT DOCUMENTS

| | | |
|---|---|---|
| CN | 203241674 U | 10/2013 |
| CN | 203535340 U | 4/2014 |
| CN | 104123038 A | 10/2014 |
| CN | 104317134 A | 1/2015 |
| CN | 104360520 A | 2/2015 |
| CN | 104730719 A | 6/2015 |
| JP | 2011232464 A | 11/2011 |

OTHER PUBLICATIONS

Dec. 21, 2015—(WO)—International Search Report and Written Opinion Appn PCT/CN2015/091168 with English Tran.

* cited by examiner

TOUCH GLASSES-FREE GRATING 3D DISPLAY DEVICE AND MANUFACTURING AND CONTROL METHODS THEREOF

The application is a U.S. National Phase Entry of International Application No. PCT/CN2015/091168 filed on Sep. 30, 2015, designating the United States of America and claiming priority to Chinese Patent Application No. 201510165936.4, filed on Apr. 9, 2015. The present application claims priority to and the benefit of the above-identified applications and the above-identified applications are incorporated by reference herein in their entirety.

TECHNICAL FIELD

At least one embodiment of the present disclosure relates to a touch glasses-free grating three-dimension (3D) display device and manufacturing and control methods thereof.

BACKGROUND

One principle of three-dimension (3D) image display (stereo display) is that left and right eyes receive images captured from different angles at the same time and the images are integrated in the human brain, so that the 3D effect of real double eyes can be simulated.

The 3D image display technology includes glasses-free and glasses type. The glasses-free 3D image display technology includes parallax barrier technology. A parallax barrier is disposed on front of a liquid crystal panel to obtain a left-eye visual field and a right-eye visual field. Meanwhile, as the manufacturing process of the parallax barrier can be compatible with the manufacturing process of a liquid crystal display (LCD), the technology is superior in mass production and cost.

Currently, touch products are also more and more favored by consumers. Under the market demand, products which integrate 3D and touch are also focus of many manufacturers. Generally, partial products which integrate 3D and touch adopt add-on mode, namely a touch panel is additionally arranged on a 3D display panel. But the structure has complex manufacturing process and high manufacturing cost. Moreover, the obtained entire module has large thickness, which is bound to affect the 3D display effect and the appearance of the product.

In addition, in the manufacturing process of integrating the parallax barrier and the liquid crystal panel, the requirement on the bonding alignment accuracy is high, so that high pixels per inch (PPI) display modules cannot be easily obtained.

SUMMARY

At least one embodiment of the present disclosure provides a touch glasses-free grating 3D display device and manufacturing and control methods thereof, which can solve the above problems and perfectly integrate 3D and 2D display and touch.

At least one embodiment of the present disclosure provides a touch glasses-free grating 3D display device, which comprises a display panel and an electrochromic 3D glasses-free grating disposed on the display panel; the electrochromic 3D glasses-free grating includes a plurality of mutually parallel first grating electrodes, a plurality of mutually parallel second grating electrodes, and an electrochromic material disposed between the plurality of first grating electrodes and the second grating electrodes corresponding thereto; both the plurality of first grating electrodes and the plurality of second grating electrodes are transparent conductive electrodes; the display panel is provided with or includes a plurality of touch electrodes which are inter-crossed with and insulated from the plurality of first grating electrodes and the plurality of second grating electrodes; the plurality of first grating electrodes and the plurality of second grating electrodes are connected with 3D driving units; and the plurality of first grating electrodes and/or the plurality of second grating electrodes and the plurality of touch electrodes are connected with touch control units.

For instance, in the touch glasses-free grating 3D display device, an ion storage layer is also disposed between the first grating electrodes and the second grating electrodes.

For instance, the touch glasses-free grating 3D display device further comprises metal wires which are in parallel connection with the first grating electrodes or the second grating electrodes.

For instance, the touch glasses-free grating 3D display device further comprises a transparent insulating layer, wherein the transparent insulating layer covers the plurality of first grating electrodes, the plurality of second grating electrodes and the electrochromic material disposed between the plurality of first grating electrodes and the second grating electrodes corresponding thereto.

For instance, the display panel includes an array substrate and an opposing substrate; and the electrochromic 3D glasses-free grating is disposed on the opposing substrate.

For instance, common electrodes are disposed on one side of the array substrate facing the opposing substrate or on one side of the opposing substrate facing the array substrate and multiplexed as the touch electrodes.

For instance, the display panel is an organic light-emitting diode (OLED) display panel.

For instance, the 3D driving units and the touch control units are integrated together to form 3D driving/touch control units.

For instance, the first grating electrodes and the second grating electrodes are respectively connected with the 3D driving/touch control units through first signal lines and second signal lines.

For instance, the first signal lines and the first grating electrodes are arranged in the same layer, and the second signal lines and the second grating electrodes are arranged in the same layer; or the first signal lines are connected with the first grating electrodes through first through holes, and the second signal lines are connected with the second grating electrodes through second through holes.

For instance, materials of the first grating electrodes and the second grating electrodes include transparent metallic films, transparent metal oxide films, non-metal oxide films or conductive particle dispersed ferroelectric materials; structures of the films include monolayer film, two-layer film or multilayer film; and the films are doped or undoped.

For instance, the electrochromic material includes iridium oxide ($IrO_3$), tungsten oxide ($WO_3$) or molybdenum oxide ($MoO_3$).

At least one embodiment of the present disclosure further provides a control method of any foregoing touch glasses-free grating 3D display device, comprising driving 3D display and touch functions in time-sharing mode, wherein the time for displaying one frame is divided into a 3D display period and a touch period; in the 3D display period, 3D display signals are applied to the first grating electrodes and the second grating electrodes respectively, so that voltage difference can be formed between the first grating electrodes and the second grating electrodes; in the touch period, touch driving signals are applied to the touch electrodes and touch sensing signals are outputted through the first grating electrodes and the second grating electrodes; or the touch driving signals are applied to the first grating electrodes and the second grating electrodes and the touch sensing signals are outputted through the touch electrodes.

At least one embodiment of the present disclosure further provides a method for manufacturing any foregoing touch glasses-free grating 3D display device, which comprises:

forming a first transparent conductive grating electrode layer, an electrochromic material layer and a second transparent conductive grating electrode layer, in which the electrochromic material layer is formed between the first transparent conductive grating electrode layer and the second transparent conductive grating electrode layer; and forming a plurality of mutually parallel first grating electrodes, a plurality of mutually parallel second grating electrodes, and an electrochromic material disposed between the plurality of mutually parallel first grating electrodes and the corresponding second grating electrodes by patterning, in which the plurality of first grating electrodes and the plurality of second grating electrodes are connected with 3D driving units; and the plurality of first grating electrodes and/or the plurality of second grating electrodes and the plurality of touch electrodes are connected with touch control units.

For instance, the method further comprises the step of forming an ion storage layer, in which the ion storage layer is disposed between the first grating electrodes and the second grating electrodes.

For instance, the method further comprises the step of forming metal wires which are in parallel connection with the first grating electrodes or the second grating electrodes.

For instance, the method further comprises the step of forming a transparent insulating layer which is configured to cover the plurality of first grating electrodes, the plurality of second grating electrodes and the electrochromic material disposed between the plurality of first grating electrodes and the second grating electrodes corresponding thereto.

For instance, the 3D driving units and the touch control units are integrated together to form 3D driving/touch control units.

For instance, the first grating electrodes and the second grating electrodes are respectively connected with the 3D driving/touch control units through first signal lines and second signal lines.

For instance, the first signal lines and the first grating electrodes are formed in the same layer, and the second signal lines and the second grating electrodes are formed in the same layer; or the first signal lines are connected with the first grating electrodes through first through holes, and the second signal lines are connected with the second grating electrodes through second through holes.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

Figure 1:
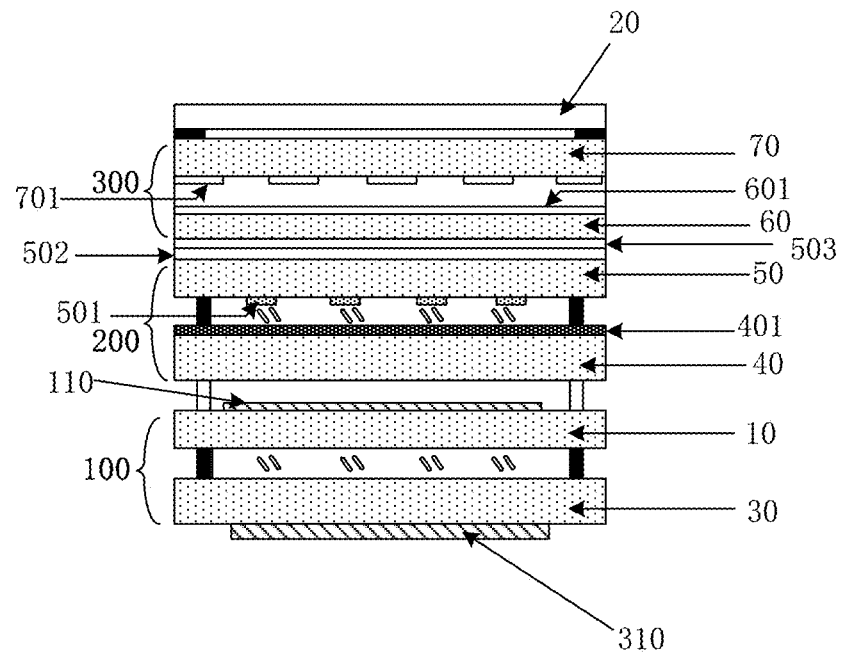
FIG. 1 is a schematic diagram of a touch glasses-free 3D display device.

Reference numerals of the accompanying drawings:
1—touch glasses-free grating 3D display device; 2—electrochromic 3D glasses-free grating; 10—opposing substrate; 10'—first substrate; 20—cover plate; 30—array substrate; 40—lower substrate of 3D liquid crystal grating; 50—upper substrate of 3D liquid crystal grating; 60—lower substrate of touch panel; 70—upper substrate of touch panel; 100—display panel; 101—first grating electrode; 102—electrochromic material; 103—second grating electrode; 104—ion storage layer; 105—transparent insulating layer; 107—metal wire; 108—3D driving/touch control unit; 1081—3D driving unit; 1082—touch control unit; 110—upper polarizer; 121—first transparent insulating layer; 122—second transparent insulating layer; 123—first metal layer; 124—second metal layer; 131—first signal line; 1311—first 3D display signal line; 132—second signal line; 133—third signal line; 1321—second 3D display signal line; 101'—first transparent conductive grating electrode layer; 1331—first touch signal line; 1341—second touch signal line; 102'—electrochromic material layer; 103'—second transparent conductive grating electrode layer; 131'—first through hole; 132'—second through hole; 200—3D liquid crystal grating; 300—touch panel; 301—touch electrode; 302—data line; 303—gate line; 304—pixel electrode; 310—lower polarizer; 350—data line; 360—gate line; 370—gate line; 380—common electrode; 390—pixel electrode; 401—transparent conductive plate electrode of 3D liquid crystal grating; 501—transparent conductive strip electrode of 3D liquid crystal grating; 502—optical clear adhesive (OCA); 503—liquid optical clear adhesive (LOCA); 601—lower touch electrode of mutual-capacitance touch panel; 701—upper touch electrode of mutual-capacitance touch panel.

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

Unless otherwise specified, the technical terms or scientific terms used herein have normal meanings understood by those skilled in the art. The words "first", "second" and the like used in the disclosure do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

The words "on" and "beneath" in the embodiments of the present disclosure are based on the sequence in the process of forming layers. For instance, films or patterns disposed above refer to films or patterns formed subsequently, and films or patterns disposed below refer to films or patterns formed previously. For clarity, the thickness of layers or areas in the accompanying drawings is magnified and not drawn according to actual ratio. When elements such as layers, films, areas and substrates are referred to as being disposed "on" another element, the element may be "directly" disposed "on" another element or an intermediate element may be provided.

FIG. 1 is a schematic diagram of a touch glasses-free 3D display device. In the touch glasses-free 3D display device, a display panel 100 is superimposed with a 3D liquid crystal grating 200 and a touch panel 300 in sequence. The display panel 100 and the 3D liquid crystal grating 200 and the 3D liquid crystal grating 200 and the touch panel 300 may be bonded through OCA 502 and/or LOCA 503.

The display panel 100 includes an array substrate 30 and an opposing substrate 10; a lower polarizer 310 is disposed beneath the array substrate 30; and an upper polarizer 110 is disposed on the opposing substrate 10. For instance, the opposing substrate 10 may be a color filter (CF) substrate. The display panel 100 includes a pixel array. When the display panel 100 is used for 3D display, the pixel array thereof includes alternately arranged left-eye pixels and right-eye pixels. The 3D liquid crystal grating 200 includes a lower substrate 40, an upper substrate 50 and liquid crystal materials disposed between the lower substrate 40 and the upper substrate 50; a transparent conductive plate electrode 401 is disposed on the lower substrate 40; and a transparent conductive strip electrode 501 is disposed on the upper substrate 50. When voltage is applied to the transparent conductive plate electrode 401 and the transparent conductive strip electrode 501, liquid crystals between the transparent conductive plate electrode 401 and the transparent conductive strip electrode 501 are driven to deflect by electric fields, so that areas between the transparent conductive plate electrode 401 and the transparent conductive strip electrode 501 are light-tight, and hence a grating can be formed and matched with the display panel 100 to achieve 3D display. When no voltage is applied to the transparent conductive plate electrode 401 and the transparent conductive strip electrode 501, light can be transmitted from areas between the lower substrate 40 and the upper substrate 50, and the grating can be matched with the display panel 100 to achieve 2D display.

The touch panel 300 includes a lower substrate 60 and an upper substrate 70; a lower touch electrode 601 is disposed on the lower substrate 60; an upper touch electrode 701 is disposed on the upper substrate 70; the lower touch electrode 602 and the upper touch electrode 701 are intercrossed with and insulated from each other and taken as touch driving electrodes and touch sensing electrodes respectively; and for instance, sensing capacitance is formed between the touch driving electrodes and the touch sensing electrodes. In the case of, for instance, finger touch, the touch position is determined by the signal output caused by the coupling of the touch sensing electrodes and touch driving signals.

In the structure of an add-on mode touch display device as shown in FIG. 1, a variety of substrates are mutually overlapped, so that the entire module has large thickness, and hence the transmittance loss is serious. Meanwhile, the manufacturing process of products is complex and the manufacturing cost is high.

Figure 2A:
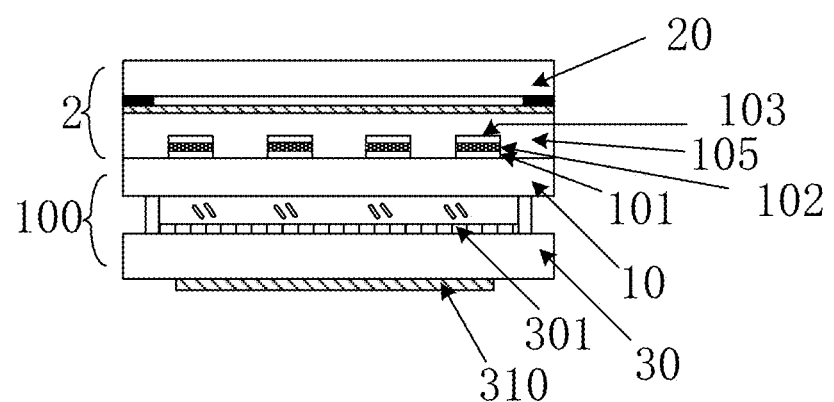
FIG. 2a is a schematic diagram of a touch glasses-free grating 3D display device provided by an embodiment of the present disclosure.

One embodiment of the present disclosure provides a touch glasses-free grating 3D display device 1, which, as illustrated in FIG. 2a, comprises a display panel 100 and an electrochromic 3D glasses-free grating 2 disposed on the display panel 100. The electrochromic 3D glasses-free grating 2 includes a plurality of first grating electrodes 101, a plurality of second grating electrodes 103 and electrochromic materials 102 disposed between the plurality of first grating electrodes 101 and the corresponding second grating electrodes 103. For instance, both the plurality of first grating electrodes 101 and the plurality of second grating electrodes 103 are transparent conductive electrodes. For instance, both the first grating electrodes 101 and the plurality of second grating electrodes 103 are arranged in parallel. For instance, both the plurality of first grating electrodes 101 and the plurality of second grating electrodes 103 are strip electrodes.

As illustrated in FIG. 2a, the display panel 100 may include an array substrate 30 and an opposing substrate 10. In the embodiment, the array substrate 30 is provided with a plurality of touch electrodes 301 which are intercrossed with and insulated from the plurality of first grating electrodes 101 and the plurality of second grating electrodes 103. It should be noted that: in other embodiments, the plurality of touch electrodes 301 may also be disposed on the opposing substrate 10, for instance, on the inside or the outside of the opposing substrate.

The plurality of first grating electrodes 101 and the plurality of second grating electrodes 103 are connected with 3D driving units. The plurality of first grating electrodes 101 and/or the plurality of second grating electrodes 103 and the plurality of touch electrodes 301 are connected with touch control units.

For instance, in one embodiment of the present disclosure, the 3D driving units and the touch control units are integrated together to form 3D driving/touch control units. The plurality of first grating electrodes 101 and/or the plurality of second grating electrodes 103 and the plurality of touch electrodes 301 are all connected with the 3D driving/touch control units.

For instance, the first grating electrodes 101 and the second grating electrodes 103 are respectively connected with the 3D driving/touch control units through first signal lines and second signal lines.

The 3D driving units are configured to apply 3D driving signals to the plurality of first grating electrodes 101 and the plurality of second grating electrodes 103 in the 3D display period, and, for instance, may include 3D driving circuits. The touch control units are mainly configured to apply touch driving signals to the touch driving electrodes and output touch sensing signals through the touch sensing electrodes in the touch period. For instance, the touch electrode 301 is taken as the touch driving electrode, and the first grating electrode 101 and/or the second grating electrode 103 is taken as the touch sensing electrode. Or vice versa, the first grating electrode 101 and/or the second grating electrode 103 is taken as the touch driving electrode, and the touch electrode 301 is taken as the touch sensing electrode. The touch control units may include touch driving circuits, touch sensing signal detection circuits, etc. The 3D driving/touch control unit integrates the functions of the 3D driving unit and the touch control unit. The 3D driving units and the touch control units may be achieved through a general integrated circuit (IC). The general IC is, for instance, a general computing device (e.g., a central processing unit (CPU)) or a processional computing device (e.g., a digital signal processor (DSP)).

For instance, the first signal lines and the first grating electrodes are arranged in the same layer, and the second signal lines and the second grating electrodes are arranged in the same layer. That is to say, the first signal lines and the first grating electrodes are formed by the same transparent conductive film, and the second signal lines and the second grating electrodes are formed by the same transparent conductive film. The first signal lines 131 and the first grating electrodes 101 are made from same materials. The second signal lines 132 and the second grating electrodes 103 are made from same materials. Thus, the manufacturing process can be simplified.

For instance, the electrochromic 3D glasses-free grating is disposed on the opposing substrate 10, namely disposed on the outside of the opposing substrate 10. For instance, the opposing substrate may be a CF substrate.

For instance, common electrodes are disposed on one side of the array substrate 30 of the display panel facing the opposing substrate 10 or on one side of the opposing substrate 10 facing the array substrate 30. At least partial common electrodes may be multiplexed as touch electrodes.

For instance, the array substrate includes a plurality of gate lines and data lines which are intercrossed with and insulated from each other. The gate lines and the data lines are intercrossed with each other and correspond to a plurality of sub-pixels.

In FIGS. 2a to 2d, the first grating electrodes 101 are closer to the display panel than the second grating electrodes 103; the plurality of first grating electrodes 101 are parallel and equally spaced; and the electrochromic materials 102 and the second grating electrodes 103 are formed on the first grating electrodes 101 at the same pitch in the direction far away from the first grating electrodes 101.

Figure 2B:
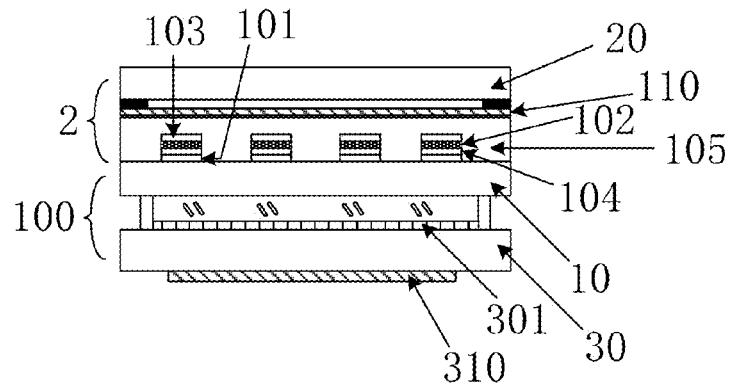
FIG. 2b is a schematic diagram of a touch glasses-free grating 3D display device provided by another embodiment of the present disclosure.

For instance, as illustrated in FIG. 2b, in one embodiment, an ion storage layer 104 may also be disposed between the first grating electrodes 101 and the second grating electrodes 103. For instance, the ion storage layer 104 may be configured to store and provide ions required for electrochromism and maintain charge balance.

For instance, the ion storage layer is made from materials such as vanadium pentoxide ($V_2O_5$) or titanium dioxide ($TiO_2$) but not limited thereto. For instance, the material of the ion storage layer includes $V_2O_5$ or $TiO2$. The $V_2O_5$ has semiconductor characteristic and layer structure and is favorable for ion transport. For instance, the thickness of the ion storage layer may be 0.2-1 μm. For instance, the ion storage material layer may be formed by semiconductor technology such as sputtering film-forming.

Figure 2C:
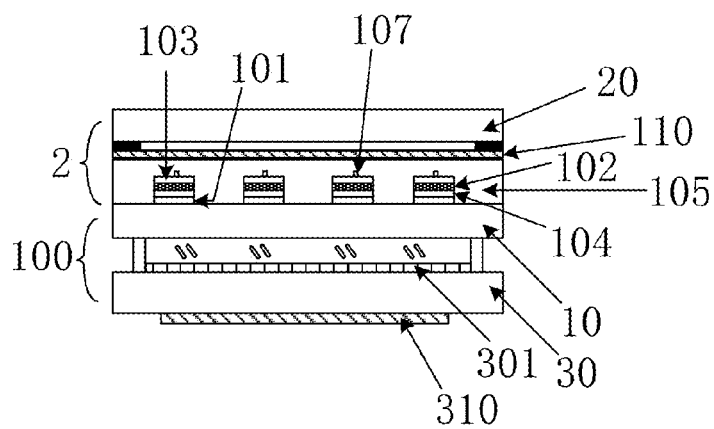
FIG. 2c is a schematic diagram of a touch glasses-free grating 3D display device provided by still another embodiment of the present disclosure.

For instance, as illustrated in FIG. 2c, in one embodiment, metal wires 107 which are in parallel connection with the second grating electrodes 103 may also be formed on the second grating electrodes 103. Thus, the overall resistance of the electrodes can be reduced, and hence the signal-to-noise ratio (SNR) can be improved when the signals are transmitted by the electrodes. Of course, the metal wires (not shown in FIG. 2c) which are in parallel connection with the first grating electrodes 101 may also be formed on or beneath the first grating electrodes 101.

For instance, materials of the first grating electrodes 101 and the second grating electrodes 103 include transparent metallic films, transparent metal oxide films, non-metal oxide films or conductive particle dispersed ferroelectric materials. Structures of the films include monolayer film, two-layer film or multilayer film, and the films are doped or undoped. For instance, the materials of the first grating electrodes and the second grating electrodes are metal oxide materials, e.g., indium tin oxide (ITO), indium zinc oxide (IZO) and tin oxide ($SnO_2$).

The electrochromic materials are disposed between the first grating electrodes 101 and the second grating electrodes 103. An electric field can be formed between the two grating electrodes in the case of energizing. Electrochromism refers to the phenomenon of reversible changes of the valent state and chemical compositions of materials under the action of an external electric field. As for the materials with electrochromic properties, under an applied voltage, due to the implantation and extraction of electrons or ions, the structure and optical and thermal properties of the materials are changed.

For instance, the electrochromic materials are in transparent state under the equipotential or power-off condition and display black state (light-tight, light-blocking state) in the case of voltage difference. Moreover, for instance, the electrochromic materials may be made from inorganic electrochromic materials such as iridium oxide ($IrO_3$), tungsten oxide (WO$_3$) or molybdenum oxide (MoO$_3$). For instance, the thickness of the electrochromic layer may be 1.5-10 μm.

Or for instance, the electrochromic materials display black state under the equipotential or power-off condition and are in transparent state in the case of voltage difference.

For instance, as illustrated in FIGS. 2a to 2d, a transparent insulating layer 105 may also be disposed on the display panel 100 and covers the plurality of first grating electrodes 101, the plurality of second grating electrodes 103 and the electrochromic materials 102 disposed between the plurality of first grating electrodes 101 and the corresponding second grating electrodes 103, so as to have, for stance, protective function and planarization function. The transparent insulating layer, for instance, may be an inorganic transparent insulating layer such as silicon oxide and silicon nitride, or may be an organic transparent insulating layer such as epoxy resin.

Figure 2D:
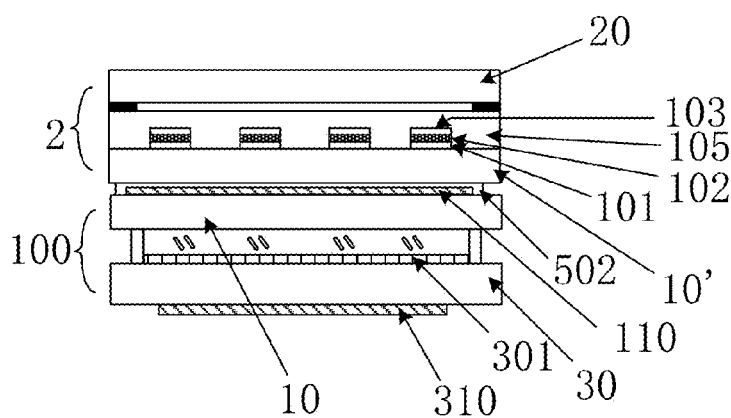
FIG. 2d is a schematic diagram of a touch glasses-free grating 3D display device provided by further still another embodiment of the present disclosure.

For instance, in the touch glasses-free grating 3D display device 1 provided by the embodiment of the present disclosure, an electrochromic 3D glasses-free grating 2 is disposed on a transparent substrate, for instance, may be directly disposed on the opposing substrate 10, and, as illustrated in FIGS. 2a to 2c, may also be disposed on a first substrate 10'. As illustrated in FIG. 2d, the first substrate 10' may be bonded with the opposing substrate 10 through OCA. The electrochromic 3D glasses-free grating 2 is directly disposed on the opposing substrate 10. The electrochromic 3D glasses-free grating 2 may be formed after the cell-assembly of the array substrate 30 and the opposing substrate 10, or the array substrate 30 is cell-assembled with the opposing substrate 10 after the electrochromic 3D glasses-free grating 2 is formed on the opposing substrate 10. No limitation will be given here in the present disclosure.

For instance, as illustrated in FIGS. 2a to 2d, in the touch glasses-free grating 3D display device 1 provided by the embodiment of the present disclosure, the electrochromic 3D glasses-free grating may further include a cover plate 20. The cover plate 20 is arranged opposite to the first substrate 10' or the opposing substrate 10 to clamp the first grating electrodes 101, the electrochromic layer 102, the second grating electrodes 103, etc. For instance, the first substrate 10' and the cover plate 20 may be made from transparent materials such as glass and plastics.

For instance, as illustrated in FIGS. 2a to 2d, the touch glasses-free grating 3D display device 1 may further comprise an upper polarizer 110 and a lower polarizer 310.

Figure 3A:
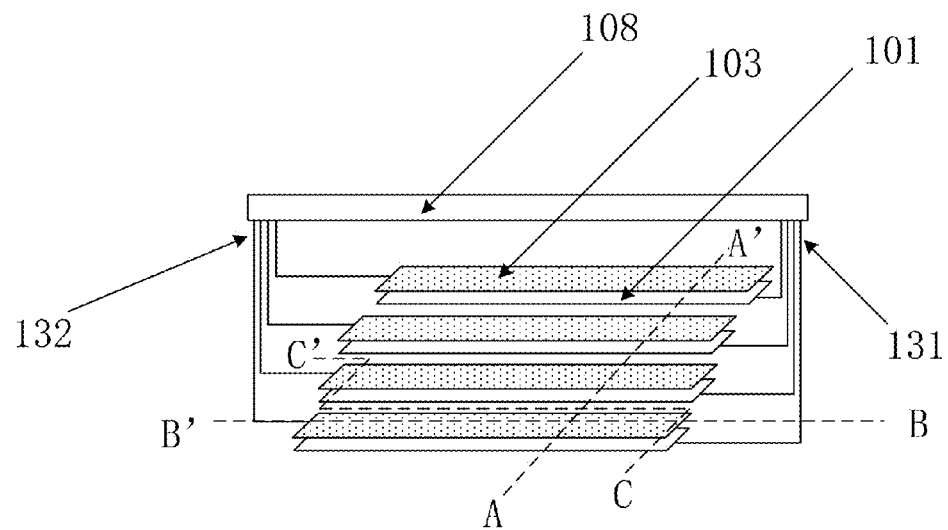
FIG. 3a is s schematic diagram illustrating the connection of first grating electrodes and second grating electrodes and 3D driving/touch control units in an embodiment of the present disclosure.

For instance, as illustrated in FIG. 3a, the first grating electrodes 101 and the second grating electrodes 103 are respectively connected with 3D driving/touch control units 108 through first signal lines 131 and second signal lines 132.

Figure 3B:
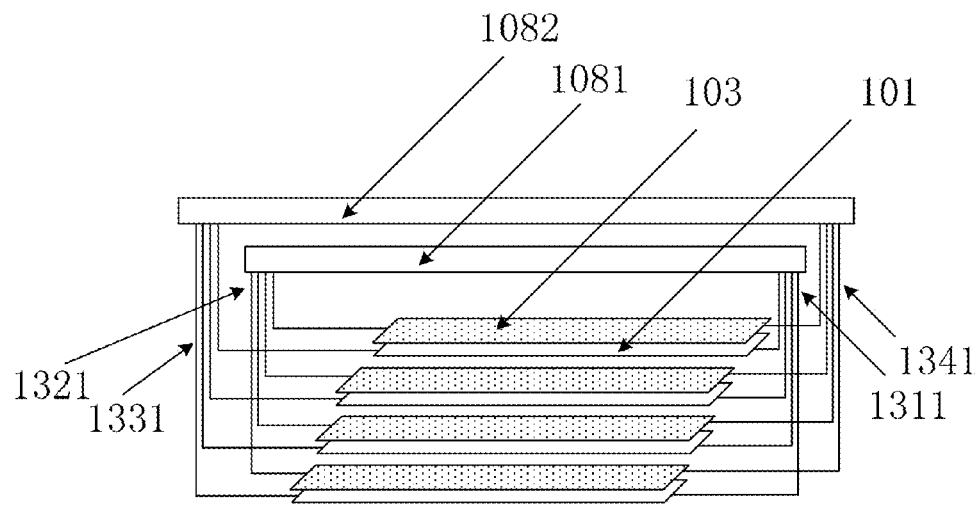
FIG. 3b is a schematic diagram illustrating the connection of first grating electrodes and second grating electrodes and 3D driving units and touch control units in an embodiment of the present disclosure.

Description is given in one embodiment of the present disclosure by taking the case that the first grating electrodes 101 and the second grating electrodes 103 are respectively connected with the 3D driving/touch control units 108 through the first signal lines 131 and the second signal lines 132 as an example. The first signal lines 131 and the second signal lines 132 are not only taken as 3D display signal lines but also taken as touch signal lines. The 3D display signal lines may also be different from the touch signal lines. For instance, as illustrated in FIG. 3b, the first grating electrodes 101 and the second grating electrodes 103 are respectively connected with 3D driving units 1081 through first 3D display signal lines 1311 and second 3D display signal lines 1321, and are respectively connected with touch control units 1082 through first touch signal lines 1331 and second touch signal lines 1341.

Figure 4A:
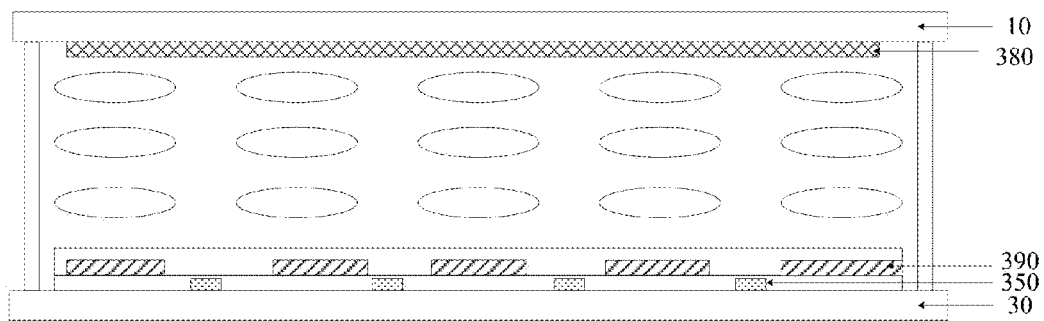
FIG. 4a is a transverse sectional view of a display panel in an embodiment of the present disclosure.
Figure 4B:
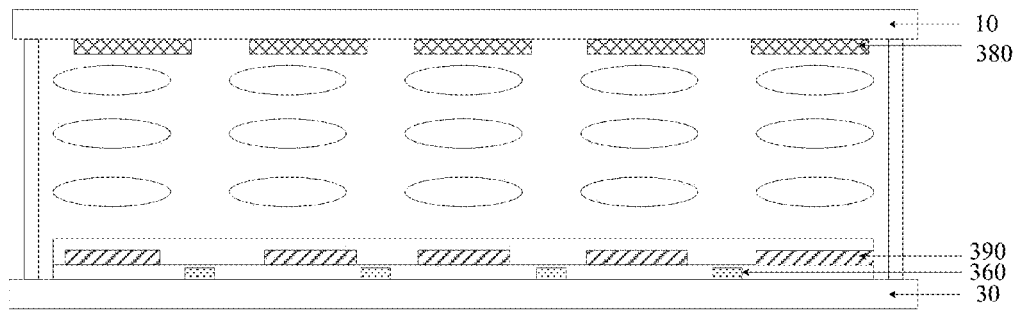
FIG. 4b is a longitudinal sectional view of the display panel in an embodiment of the present disclosure.

For instance, in the touch glasses-free grating 3D display device 1 provided by one embodiment of the present disclosure, the display panel 100 may include an LCD panel or an OLED display panel. When the display panel 100 is an LCD panel, vertical alignment (VA) display mode may be adopted, and advanced super dimension switch (ADS) display mode, twisted nematic (TN) display mode or in-plane switching (IPS) display mode may also be adopted. No specific limitation will be given here, as long as a plurality of, e.g., strip touch electrodes 301, which are intercrossed with and insulated from the plurality of first grating electrodes 101 and the plurality of second grating electrodes 103, are formed in or on the display panel. A plurality of strip touch electrodes 301 may be independently formed in the display panel 100. Common electrodes may also be multiplexed as touch electrodes 301. The display panel 100 may be as shown in FIG. 4a or 4b. As for a TN mode LCD panel, the array substrate 30 is provided with a plurality of gate lines 360 and a plurality of data lines 350; the gate lines 360 and the data lines 350 are intercrossed with and insulated from each other; common electrodes 380 are disposed on the opposing substrate 10; vertical electric fields are formed between the common electrodes 380 and pixel electrodes 390; and the common electrodes 380 may be multiplexed as touch electrodes in the process of forming the touch glasses-free grating 3D display device.

It should be noted that the common electrodes 380 may also be disposed on the array substrate 30, namely the LCD panel adopts the IPS, ADS or other display modes at this point. When the common electrodes are multiplexed as the touch electrodes, the case may be as shown in FIGS. 2a to 2d. No specific limitation will be given in the present disclosure.

The display panel 100 in the embodiment of the present disclosure is not limited to be an LCD panel and may also be an OLED display panel. When the display panel 100 is an OLED display panel, the electrochromic 3D glasses-free grating 2 is disposed on a light-emitting side of the OLED display panel. For instance, if the OLED includes a cover plate for covering an organic function layer structure, the electrochromic 3D glasses-free grating 2 is disposed on the cover plate. When the display panel 100 is an LCD panel, the electrochromic 3D glasses-free grating 2 is, for instance, disposed on a light-emitting side of the LCD panel.

At least one embodiment of the present disclosure further provides a control method of any foregoing touch glasses-free grating 3D display device. The method drives 3D display and touch functions in time-sharing mode. The time for displaying one frame may be divided into a 3D display period and a touch period. In the 3D display period, 3D driving signals are applied to the first grating electrodes 101 and the second grating electrodes 103 respectively, so that voltage difference can be formed between the first grating electrodes 101 and the second grating electrodes 103, and hence the grating can be obtained. In the touch period, touch driving signals are applied to the touch electrodes 301, and touch sensing signals are outputted through the first grating electrodes 101 and the second grating electrodes 103.

Figure 5A:
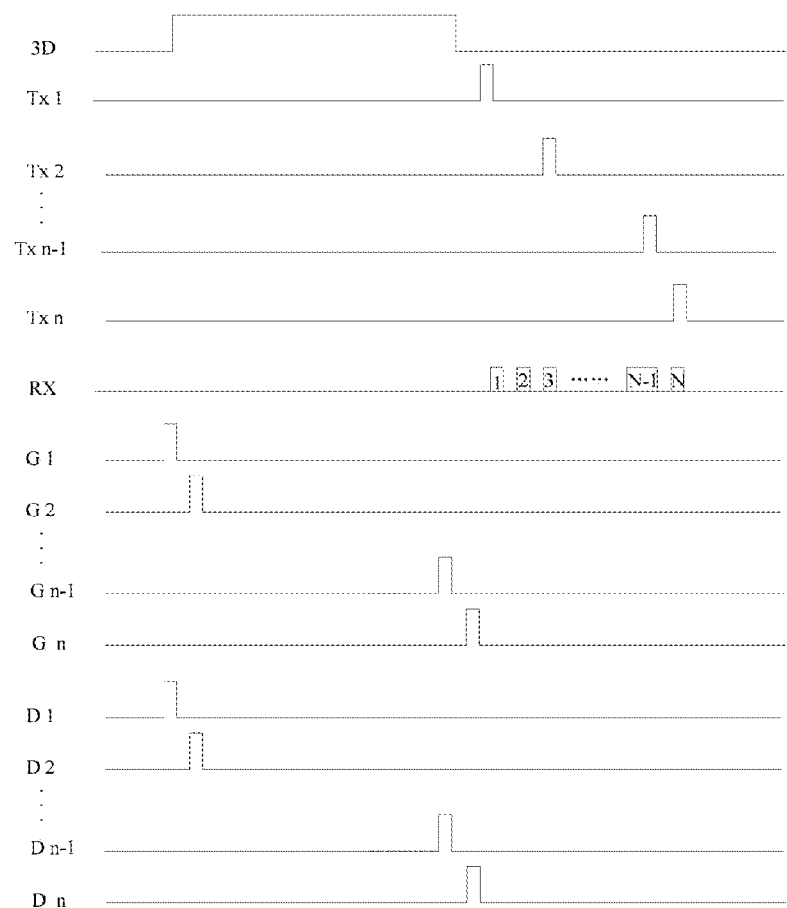
FIG. 5a is a schematic diagram illustrating the drive timing sequence of the touch glasses-free grating 3D display device provided by an embodiment of the present disclosure.
Figure 5B:
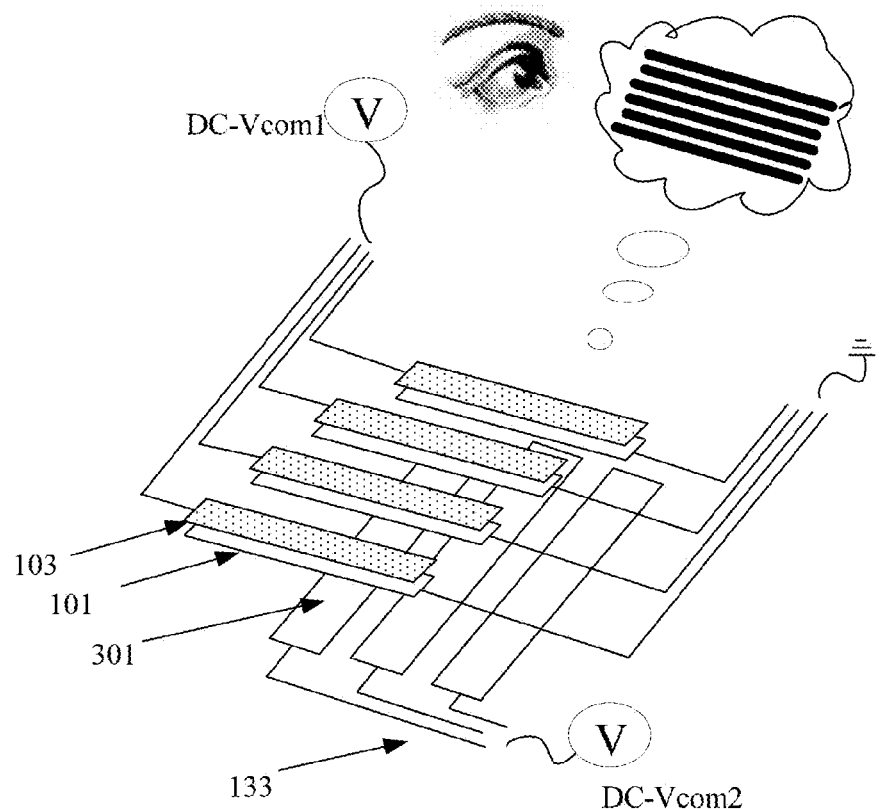
FIG. 5b is a schematic diagram illustrating the display principle of the touch glasses-free grating 3D display device provided by an embodiment of the present disclosure.

For instance, 3D driving circuits 3D (3D1, 3D2 3Dn−1, 3Dn) are arranged; touch driving circuits Tx (Tx1, Tx2 Txn−1, Txn) are arranged; and the drive timing sequence of the 3D driving circuits and the touch driving circuits Tx may be as shown in FIG. 5a, but not limited thereto. As illustrated in FIGS. 5a and 5b, in the 3D display period, 3D driving voltage signals are applied to the first grating electrodes 101 and the second grating electrodes 103. For instance, at this point, the first grating electrodes are all grounded. Voltage signals (Vcom1) are applied to the second grating electrodes 103. Voltage difference is formed between the first grating electrodes 101 and the second grating electrodes 103, and vertical electric fields are formed. Therefore, the electrochromic material disposed between the first grating electrodes 101 and the second grating electrodes 103 will turn black (light-tight, light-blocking state) along with the electric fields. That is to say, areas at which the electric fields are vertically distributed will become black areas, and areas not direct opposite to the electric fields (namely areas between the grating electrodes in the horizontal direction) will still be in the light-transmitting state. Thus, a transverse alternating black and white grating can be formed and can have the function of a parallax barrier, and hence the grating can be matched with the display panel to achieve the glasses-free 3D display effect. For instance, as illustrated in FIG. 5a, as shown by the 3D driving circuits therein, 3D signals may be all applied in the 3D display period, or as shown by gate driving circuits G (G1, G2, G3 . . . ), 3D driving signals may also be applied to 3D1, 3D2 . . . 3Dn−1, 3Dn by progressive scanning. No limitation will be given in the present disclosure.

Figure 5C:
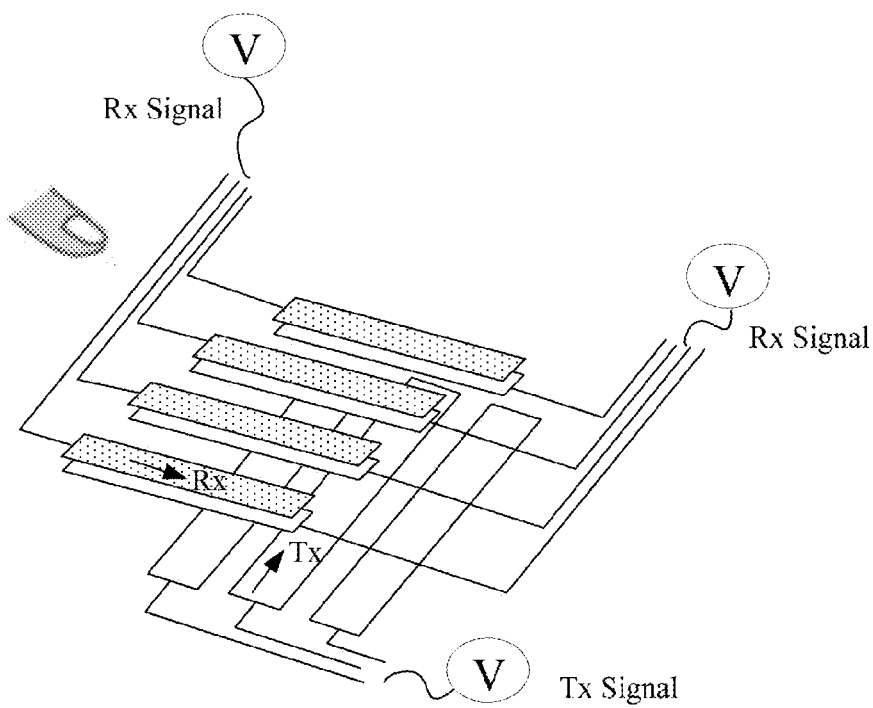
FIG. 5c is a schematic diagram illustrating the touch principle of the touch glasses-free grating 3D display device provided by an embodiment of the present disclosure.

As illustrated in FIGS. 5a and 5c, in the touch period, for instance, driving signals TX are inputted into the touch electrodes of the display panel, and touch sensing signals are outputted through the first grating electrodes 101 and the second grating electrodes 103. When the touch 3D display device is touched by a user via a finger, a touch pen or the like, the capacitance value of the touch capacitance at the touch position will be affected and changed; and information such as current caused by the variation of the capacitance value is transmitted through corresponding touch sensing electrodes and detected and recorded by the touch control units or the 3D driving/touch control units. That is to say, signal output, caused by the coupling of touch driving signals, on the first grating electrodes 101 and the second grating electrodes 103 are detected, and hence the touch position can be determined. This means may be adopted to achieve touch.

For instance, the array substrate includes a plurality of gate lines and data lines which are intercrossed with and insulated from each other; common electrodes are disposed on the array substrate or the opposing substrate; gate driving circuits G (G1, G2, G3 . . . ) and source driving circuits D (D1, D2, D3 . . . ) are arranged; and the drive timing sequence of the gate driving circuit G and the source driving circuit D may be as shown in FIG. 5a.

In the 3D display period, gate-on signals are applied to the gate lines; data signals are applied to the data lines; and common voltage (Vcom2) is applied to the common electrodes, so that display drive electric fields can be formed between the common electrodes and pixel electrodes in pixel units of the display panel to drive liquid crystals to deflect for display. In the touch period, for instance, gate-off signals are applied to the gate lines, and no data signal is inputted into the data lines.

The drive timing sequence of the gate driving circuit G and the source driving circuit may be as shown in FIG. 5a, but not limited thereto.

For instance, when the common electrodes are multiplexed as the touch electrodes, in the touch period, driving signals TX are inputted into the common electrodes.

For instance, the time for displaying one frame of the touch glasses-free grating 3D display device is 16.7 ms, in which the 3D display period is 12.7 ms and the touch period is 4 ms. In actual application, the duration of the 3D display period and the touch period may also be properly adjusted according to the processing ability of an IC chip. No specific limitation will be given here.

For instance, when the display panel drives the display and touch functions in time-sharing mode, display period and touch period are divided. The display period of the display panel may be same with or different from the 3D display period. No specific limitation will be given here.

For instance, as illustrated in FIG. 5b, the touch electrodes 301 are connected with the 3D driving/touch control units through third signal lines 133. For instance, when the common electrodes of the display panel are multiplexed as the touch electrodes, common electrode lines may be correspondingly multiplexed as the third signal lines 133, but not limited thereto.

In another embodiment of the present disclosure, touch driving signals are applied to the first grating electrodes 101 and the second grating electrodes 103, and touch sensing signals are outputted through the touch electrodes 301.

In the driving method, within the time for displaying one frame, as for the scanning process of the first grating electrodes 101 and the second grating electrodes 103, 3D display scanning is performed at first and hence touch scanning is performed. But touch scanning may also be performed at first and hence 3D display scanning is performed. No specific limitation will be given in the present disclosure.

As stated above, the electrochromic materials are in transparent state under the equipotential or power-off condition. The electrochromic 3D glasses-free grating will no longer work, and the display device may achieve general 2D display. For instance, if the mode of a 3D grating module must be converted from 3D mode to 2D mode, the first grating electrodes 101 and the second grating electrodes 103 must be all grounded in the 3D display period, but the control method in the touch period may be not changed.

At least one embodiment of the present disclosure further provides a method for manufacturing any foregoing touch glasses-free grating 3D display device, which, as illustrated in FIGS. 6a to 6d which are A-A' sectional views of FIG. 3a, comprises the following manufacturing processes.

Figure 6A:
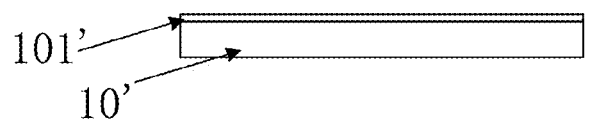
FIGS. 6a to 6d are schematic diagrams illustrating the manufacturing process of an electrochromic 3D glasses-free grating in the touch glasses-free grating 3D display device provided by an embodiment of the present disclosure.
Figure 6B:
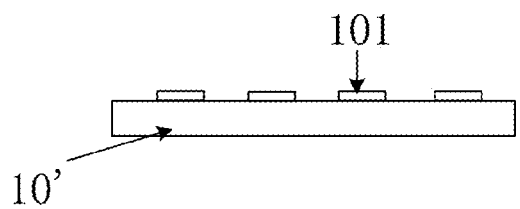

Firstly, as illustrated in FIG. 6a, a first transparent conductive grating electrode layer 101' is formed on a first substrate 10'; and as illustrated in FIG. 6b, first signal lines (not shown in the figure, may refer to FIG. 3a) and a plurality of mutually parallel first grating electrodes 101 are formed by patterning the first transparent conductive grating electrode layer 101'.

Figure 6C:
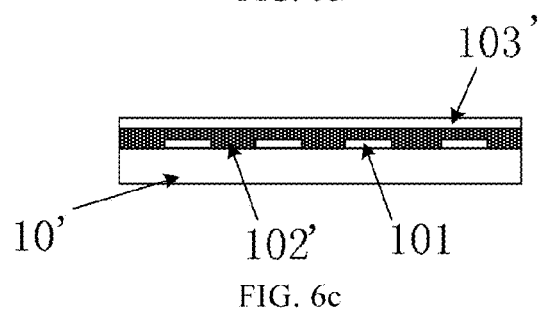

As illustrated in FIG. 6c, an electrochromic material layer 102' is formed on the first signal lines and the plurality of mutually parallel first grating electrodes 101, and subsequently, a second transparent conductive grating electrode layer 103' is formed on the electrochromic material layer 102'.

Figure 6D:
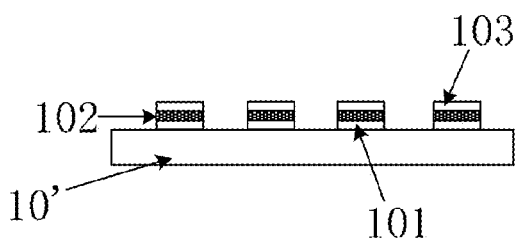

As illustrated in FIG. 6d, second signal lines (not shown in the figure, may refer to FIG. 3a), a plurality of mutually parallel second grating electrodes 103 and electrochromic materials 102 disposed between the plurality of first grating electrodes 101 and the corresponding second grating electrodes 103 are formed by patterning an superimposed layer of the electrochromic material layer 102' and the second transparent conductive grating electrode layer 103'.

In another embodiment of the present disclosure, a first transparent conductive grating electrode layer 101' is formed on a first substrate 10'; first signal lines are formed by patterning the first transparent conductive grating electrode layer 101'; an electrochromic material layer 102' and a second transparent conductive grating electrode layer 103' are formed on the first transparent conductive grating electrode layer 101' provided with the first signal lines; and second signal lines, a plurality of mutually parallel first grating electrodes 101, a plurality of mutually parallel second grating electrodes 103 and electrochromic materials 102 disposed between the plurality of mutually parallel first grating electrodes 101 and the corresponding second grating electrodes 103 are formed by patterning an superimposed layer of the first transparent conductive grating electrode layer 101', the electrochromic material layer 102' and the second transparent conductive grating electrode layer 103'.

The obtained first grating electrodes 101 and the obtained second grating electrodes 103 are respectively connected with 3D driving/touch control units 108 through first signal lines and second signal lines (not shown in the figure, may refer to FIG. 3a).

Figure 7A:
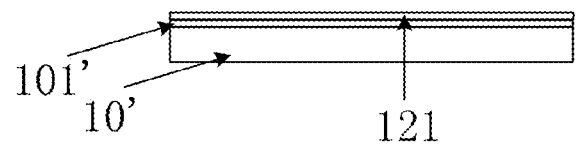
FIGS. 7a to 7i are schematic diagrams illustrating the manufacturing process of an electrochromic 3D glasses-free grating in the touch glasses-free grating 3D display device provided by another embodiment of the present disclosure.
Figure 7B:
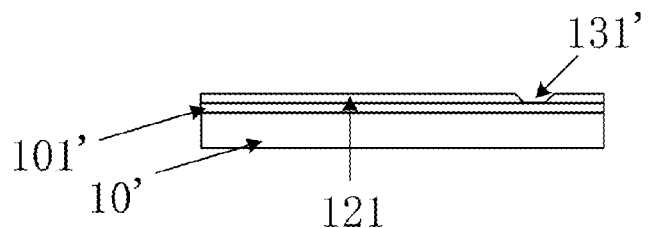
Figure 7C:
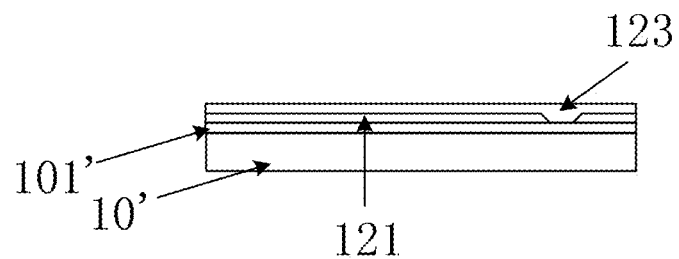
Figure 7D:
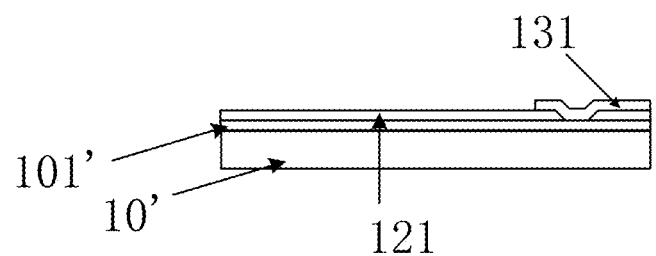
Figure 7E:
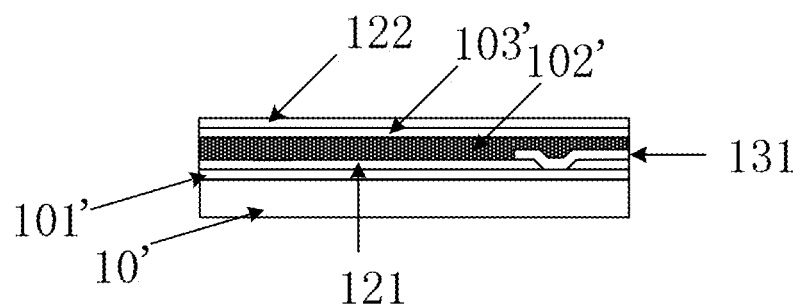
Figure 7F:
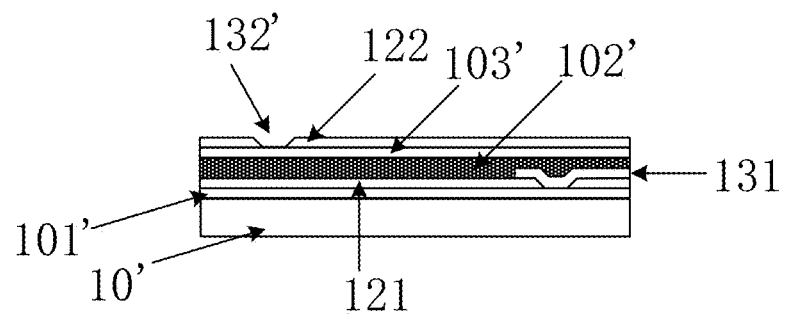
Figure 7G:
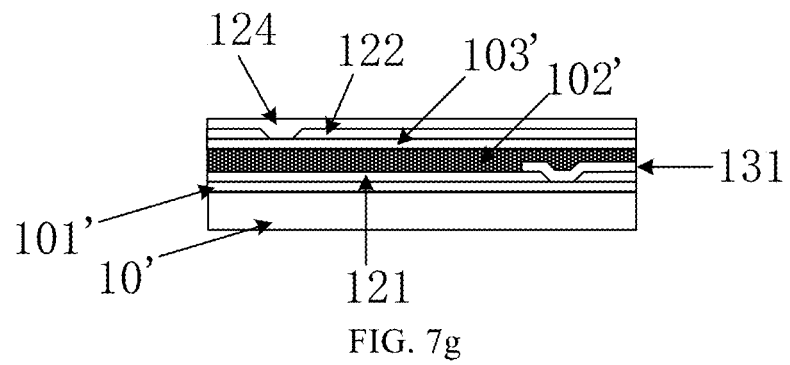
Figure 7H:
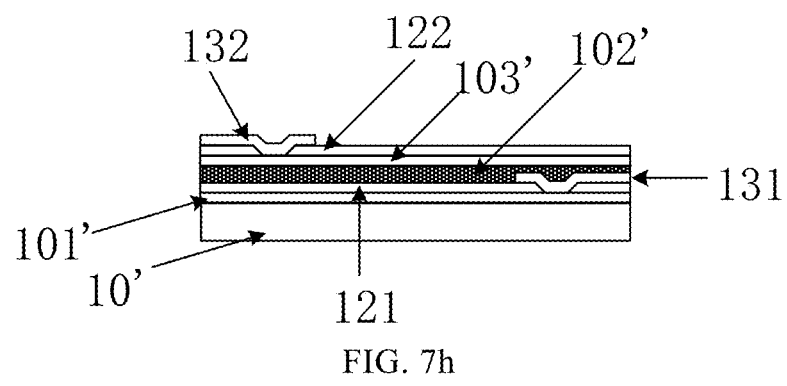
Figure 7I:
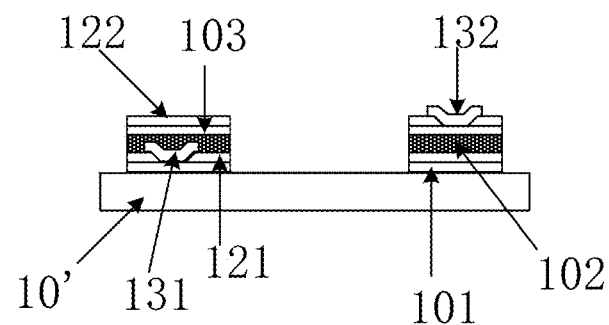

As illustrated in FIGS. 7a to 7i, in which FIGS. 7a to 7h are B-B' sectional views of FIG. 3a and FIG. 7i is a C-C' sectional view of FIG. 3a, another embodiment of the present disclosure further provides a method for manufacturing a touch glasses-free grating 3D display device. The method comprises the following steps.

Forming a first transparent conductive grating electrode layer 101' and a first transparent insulating layer 121 on a first substrate 10', as shown in FIG. 7a.

Forming first through holes 131' in the first transparent insulating layer 121, as shown in FIG. 7b.

Forming a first metal layer 123 on the first transparent insulating layer, as shown in FIG. 7c, and forming first signal lines 131 by patterning the first metal layer 123, as shown in FIG. 7d.

Forming an electrochromic material layer 102' on the first signal lines 131, forming a second transparent conductive grating electrode layer 103' on the electrochromic material layer 102', and forming a second transparent insulating layer 122 on the second transparent conductive grating electrode layer 103', as shown in FIG. 7e.

Forming second through holes 132' in the second transparent insulating layer 122, as shown in FIG. 7f.

Forming a second metal layer 124 on the second transparent insulating layer 122, as shown in FIG. 7g, and forming second signal lines 132 by patterning the second metal layer 124, as shown in FIG. 7h.

Subsequently, as illustrated in FIG. 7i, forming a plurality of mutually parallel first grating electrodes 101, a plurality of mutually parallel second grating electrodes 103 and electrochromic materials 102 disposed between the plurality of mutually parallel first grating electrodes 101 and the corresponding second grating electrodes 103 by patterning the obtained superimposed layer. Herein, the first signal lines 131 and the second signal lines 132 are respectively connected with the first grating electrodes 101 and the second grating electrodes 103 through first through holes 131' and second through holes 132'. For instance, the first signal lines 131 and the second signal lines 132 may adopt metallic materials. For instance, the first grating electrodes 101 and the second grating electrodes 103 are respectively connected with 3D driving/touch control units 108 through the first signal lines 131 and the second signal lines 132.

For instance, the method may further comprise the step of forming an ion storage layer 104 which is disposed between the first grating electrodes 101 and the second grating electrodes 103.

For instance, the method may further comprise the step of forming a transparent insulating layer 105 which is configured to cover the plurality of first grating electrodes 101, the plurality of second grating electrodes 103 and the electrochromic materials 102 disposed between the plurality of first grating electrodes 101 and the corresponding second grating electrodes 103.

For instance, the method may further comprise the step of forming metal wires 107 which are in parallel connection with the second grating electrodes 103. Thus, the overall resistance of the electrodes can be reduced, and hence the SNR when signals are transmitted by the electrodes can be improved.

For instance, in the method, a transparent insulating layer may also be formed between the first grating electrodes 101 and the second grating electrodes 103, so that the first grating electrodes 101 and the second grating electrodes 103 can be better isolated. For instance, the transparent insulating layer may be made from SiNx, SiOx or other appropriate materials.

It should be noted that: in the above methods, the first substrate 10' is a transparent substrate. The first substrate 10' may be bonded together with the opposing substrate 10 of the LCD panel or the cover plate of the OLED display panel to form the touch glasses-free grating 3D display device. And the opposing substrate of the display panel or the cover plate of the OLED display panel may also be taken as the first substrate.

The touch glasses-free grating 3D display device provided by the embodiments of the present disclosure may also be manufactured by methods apart from the above method. No specific limitation will be given here.

Figure 8A:
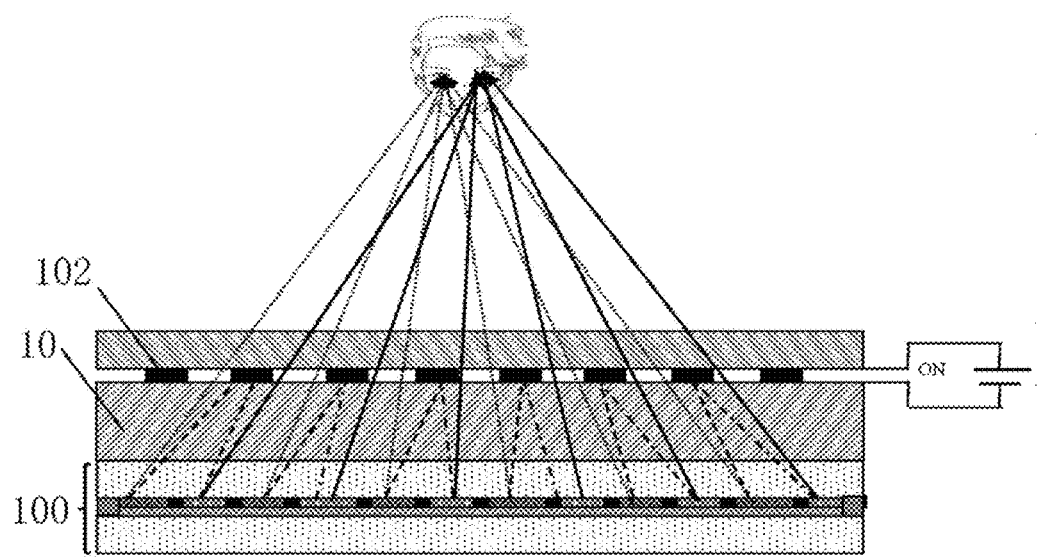
FIG. 8a is a schematic diagram illustrating the 3D display of the touch glasses-free grating 3D display device provided by an embodiment of the present disclosure.
Figure 8B:
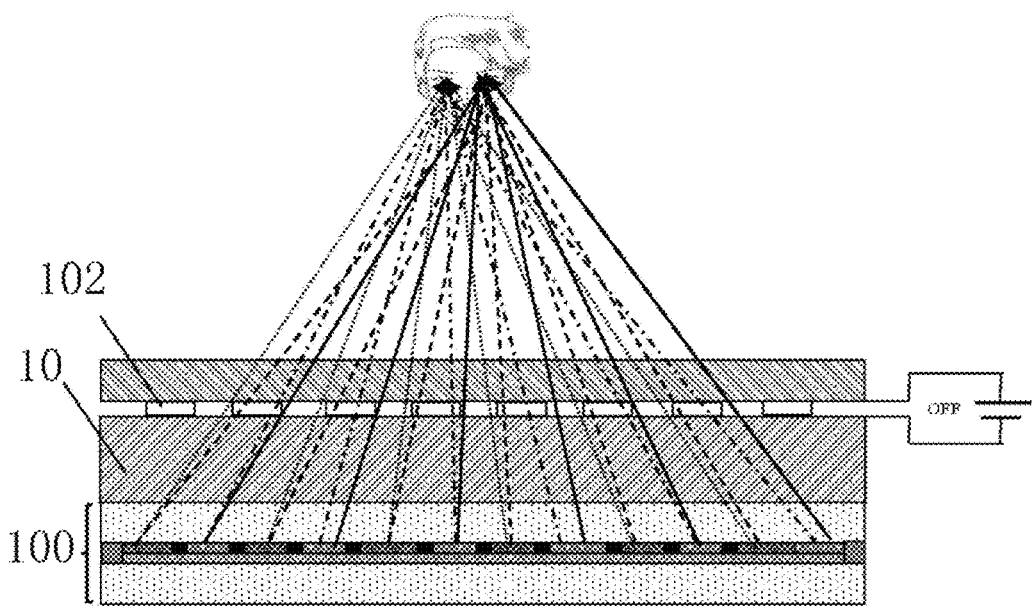
FIG. 8b is a schematic diagram illustrating the 2D display of the touch glasses-free grating 3D display device provided by an embodiment of the present disclosure.

In the touch glasses-free grating 3D display device provided by one embodiment of the present disclosure, the electrochromic materials are in transparent state when 3D driving voltage is not applied and are in light-shielding state when the 3D driving voltage is applied. When the 3D driving voltage is applied to the electrochromic grating, the electrochromic materials at corresponding positions of light-shielding patterns will change color, e.g., turn black. Partial light emitted from the display panel 100 is shielded by portions which turn black, and partial light is transmitted from gaps of light-shielding patterns not provided with the electrochromic materials, so that the function of the grating can be achieved. A left-eye image and a right-eye image displayed by the display panel are respectively projected to a left-eye visual field and a right-eye visual field on front of the display panel. A 3D image can be viewed when the left eye and the right eye of a viewer are respectively disposed in the left-eye visual field and the right-eye visual field, and at this point, glasses-free 3D display can be achieved, as shown in FIG. 8a. When the 3D driving voltage is removed, the electrochromic materials at the corresponding positions of the light-shielding patterns are restored to be in transparent state; all the light emitted from the display panel 100 is transmitted, and no shielding is provided; and at this point, 2D display is achieved, as shown in FIG. 8b. Therefore, by utilization of the touch glasses-free grating 3D display device provided by any foregoing embodiment of the present disclosure, glasses-free 3D display can be conveniently achieved; the glasses-free 3D display state and the 2D display state can be conveniently switched; and meanwhile the touch function can be also achieved. In addition, the positions of the light-shielding patterns of the electrochromic grating provided by any foregoing embodiment of the present disclosure are fixed, so that light-shielding areas and light-transmitting areas can be strictly distinguished and do not interfere with each other, and hence the 2D display effect cannot be affected. Thus, users can have good use experience.

Figure 8C:
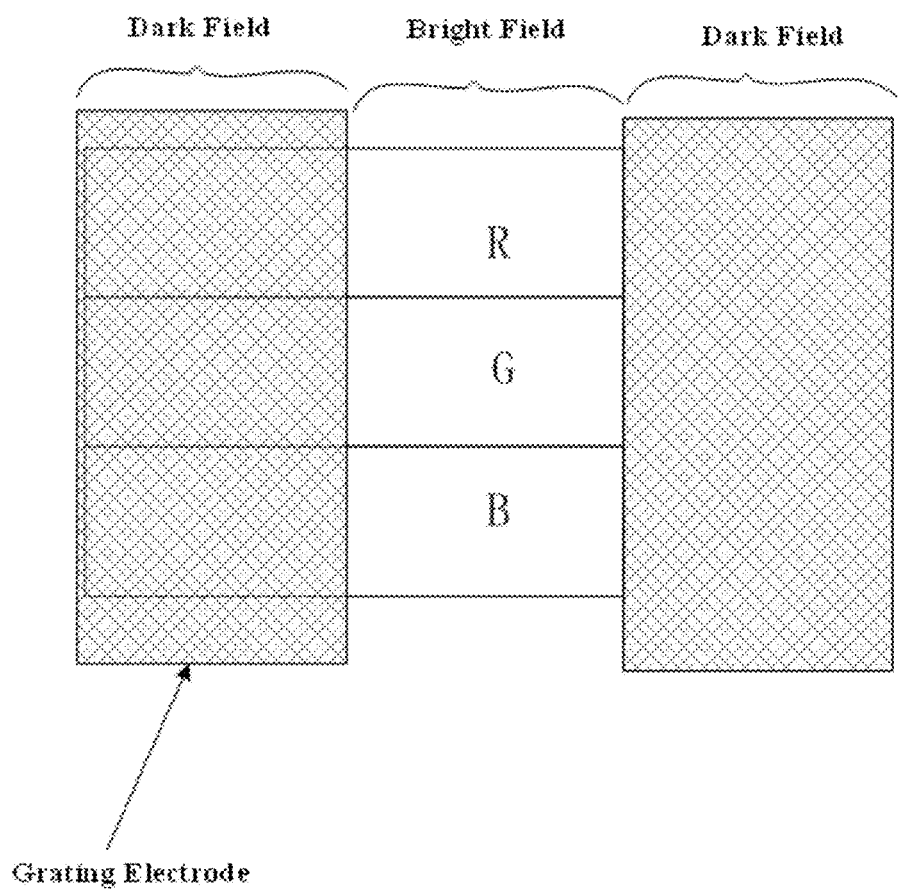
FIG. 8c is a schematic diagram in which the pixel pitch is shielded by strip grating electrodes of the electrochromic 3D glasses-free grating in the touch glasses-free grating 3D display device provided by an embodiment of the present disclosure.

FIG. 8c illustrates the mode that the pixel pitch is shielded by strip grating electrodes (the first grating electrodes and the second grating electrodes) of the touch glasses-free grating 3D display device provided by one embodiment of the present disclosure. For instance, the pixel pitch is shielded in accordance with half pixel unit, but not limited thereto.

For instance, the display device provided by the embodiments of the present disclosure may be any product or component with display function such as a mobile phone, a tablet PC, a TV, a display, a notebook computer, a digital picture frame, a navigator or the like.

In the electrochromic 3D glasses-free grating of the touch glasses-free grating 3D display device provided by the embodiments of the present disclosure, the first grating electrodes and the second grating electrodes not only can be applied with 3D driving voltage signals but also can be applied with touch driving signals or output touch sensing signals. Therefore, not only the 3D display function can be achieved but also the touch function can be achieved. The thickness of the module is reduced to any great degree. Moreover, when the opposing substrate (e.g., a CF substrate) of the display panel or the cover plate (e.g., an OLED display device) is also taken as the first substrate of the electrochromic 3D glasses-free grating, the thickness can be greatly reduced compared with the module adopting the superimposed mode as shown in FIG. 1.

As for the design of the signal lines, the transparent conductive grating electrode layer may be taken as the signal lines on the premise of satisfying the design requirement, which is more economical. Of course, when metal wirings are taken as the signal lines, mask process may be adopted, and the insulating layer is provided with through holes.

When the first grating electrodes and the second grating electrodes are manufactured, the first grating electrodes and the second grating electrodes may be directly formed on the first substrate by accurate alignment mask process, for instance, may be directly formed on the opposing substrate after cell-assembly. Therefore, the problem of alignment accuracy of the traditional grating cell can be solved; high-PPI 3D display effect can be satisfied; and meanwhile, the thickness of the module structure can be greatly reduced compared with the traditional 3D grating cell, and the transmittance can be also greatly improved.

In the touch glasses-free grating 3D display device provided by the embodiments of the present disclosure, additional mask process may be not required, and 3D display and touch can be perfectly integrated via time-sharing driving mode as long as the common grating electrodes are taken as driving electrodes or sensing electrodes.

Due to the above described advantages, by adoption of the touch glasses-free grating 3D display device provided by the embodiment of the present disclosure, the added value of the module can be increased and the competitiveness of products can be improved.

The foregoing is only the preferred embodiments of the present disclosure and not intended to limit the scope of protection of the present disclosure. Any change or replacement that may be easily thought of by those skilled in the art within the technical scope disclosed by the present disclosure shall fall within the scope of protection of the present disclosure. Therefore, the scope of protection of the present disclosure shall be defined by the appended claims.

The application claims priority to the Chinese patent application No. 201510165936.4, filed on Apr. 9, 2015, the disclosure of which is incorporated herein by reference as part of the application.

The invention claimed is:

1. A touch glasses-free grating three-dimension (3D) display device, comprising a display panel and an electrochromic 3D glasses-free grating disposed on the display panel, wherein
   the electrochromic 3D glasses-free grating includes a plurality of mutually parallel first grating electrodes, a plurality of mutually parallel second grating electrodes, and an electrochromic material disposed between the plurality of first grating electrodes and the second grating electrodes corresponding thereto; both the plurality of first grating electrodes and the plurality of second grating electrodes are transparent conductive electrodes;
   the display panel is provided with or includes a plurality of touch electrodes which are intercrossed with and insulated from the plurality of first grating electrodes and the plurality of second grating electrodes; the plurality of first grating electrodes and the plurality of second grating electrodes are connected with 3D driving units; and the plurality of first grating electrodes and/or the plurality of second grating electrodes and the plurality of touch electrodes are connected with touch control units.

2. The touch glasses-free grating 3D display device according to claim 1, wherein an ion storage layer is also disposed between the first grating electrodes and the second grating electrodes.

3. The touch glasses-free grating 3D display device according to claim 1, further comprising metal wires which are in parallel connection with the first grating electrodes or the second grating electrodes.

4. The touch glasses-free grating 3D display device according to claim 1, further comprising a transparent insulating layer, wherein the transparent insulating layer covers the plurality of first grating electrodes, the plurality of second grating electrodes, and the electrochromic material disposed between the plurality of first grating electrodes and the second grating electrodes corresponding thereto.

5. The touch glasses-free grating 3D display device according to claim 1, wherein the display panel includes an array substrate and an opposing substrate; and the electrochromic 3D glasses-free grating is disposed on the opposing substrate.

6. The touch glasses-free grating 3D display device according to claim 5, wherein common electrodes are disposed on one side of the array substrate facing the opposing substrate or on one side of the opposing substrate facing the array substrate, and the common electrodes are multiplexed as the touch electrodes.

7. The touch glasses-free grating 3D display device according to claim 1, wherein the display panel is an organic light-emitting diode (OLED) display panel.

8. The touch glasses-free grating 3D display device according to claim 1, wherein the 3D driving units and the touch control units are integrated together to obtain 3D driving/touch control units.

9. The touch glasses-free grating 3D display device according to claim 8, wherein the first grating electrodes and the second grating electrodes are respectively connected with the 3D driving/touch control units through first signal lines and second signal lines.

10. The touch glasses-free grating 3D display device according to claim 9, wherein the first signal lines and the first grating electrodes are arranged in a same layer, and the second signal lines and the second grating electrodes are arranged in a same layer; or the first signal lines are connected with the first grating electrodes through first through holes, and the second signal lines are connected with the second grating electrodes through second through holes.

11. The touch glasses-free grating 3D display device according to claim 1, wherein materials of the first grating electrodes and the second grating electrodes include transparent metallic films, transparent metal oxide films, non-metal oxide films or conductive particle dispersed ferroelectric materials; structures of the films include monolayer film, two-layer film or multilayer film; and the films are doped or undoped.

12. The touch glasses-free grating 3D display device according to claim 1, wherein the electrochromic material includes iridium oxide ($IrO_3$), tungsten oxide ($WO_3$) or molybdenum oxide ($MoO_3$).

13. A control method of the touch glasses-free grating 3D display device according to claim 1, comprising driving 3D display and touch functions in a time-sharing mode,
wherein time for displaying one frame is divided into a 3D display period and a touch period;
in the 3D display period, 3D display signals are applied to the first grating electrodes and the second grating electrodes respectively, so that voltage difference can be formed between the first grating electrodes and the second grating electrodes; and
in the touch period, touch driving signals are applied to the touch electrodes and touch sensing signals are outputted through the first grating electrodes and the second grating electrodes, or the touch driving signals are applied to the first grating electrodes and the second grating electrodes and the touch sensing signals are outputted through the touch electrodes.

14. A method for manufacturing a touch glasses-free grating three-dimension (3D) display device, comprising:
forming a first transparent conductive grating electrode layer, an electrochromic material layer and a second transparent conductive grating electrode layer, in which the electrochromic material layer is formed between the first transparent conductive grating electrode layer and the second transparent conductive grating electrode layer;
forming a plurality of mutually parallel first grating electrodes, a plurality of mutually parallel second grating electrodes, and an electrochromic material disposed between the plurality of mutually parallel first grating electrodes and the corresponding second grating electrodes by patterning; and
forming a plurality of touch electrodes, and the plurality of touch electrodes are intercrossed with and insulated from the plurality of first grating electrodes and the plurality of second grating electrodes, in which
the plurality of first grating electrodes and the plurality of second grating electrodes are connected with 3D driving units; and the plurality of first grating electrodes and/or the plurality of second grating electrodes and the plurality of touch electrodes are connected with touch control units.

15. The method for manufacturing the touch glasses-free grating 3D display device according to claim 14, further comprising:
forming an ion storage layer, in which the ion storage layer is disposed between the first grating electrodes and the second grating electrodes.

16. The method for manufacturing the touch glasses-free grating 3D display device according to claim 14, further comprising:
forming metal wires which are in parallel connection with the first grating electrodes or the second grating electrodes.

17. The method for manufacturing the touch glasses-free grating 3D display device according to claim 14, further comprising:
forming a transparent insulating layer which is configured to cover the plurality of first grating electrodes, the plurality of second grating electrodes and the electrochromic material disposed between the plurality of first grating electrodes and the second grating electrodes corresponding thereto.

18. The method for manufacturing the touch glasses-free grating 3D display device according to claim 14, wherein the 3D driving units and the touch control units are integrated together to obtain 3D driving/touch control units.

19. The method for manufacturing the touch glasses-free grating 3D display device according to claim 18, wherein the first grating electrodes and the second grating electrodes are respectively connected with the 3D driving/touch control units through first signal lines and second signal lines.

20. The method for manufacturing the touch glasses-free grating 3D display device according to claim 19, wherein the first signal lines and the first grating electrodes are formed in the same layer, and the second signal lines and the second grating electrodes are formed in the same layer; or the first signal lines are connected with the first grating electrodes through first through holes, and the second signal lines are connected with the second grating electrodes through second through holes.

* * * * *